United States Patent [19]
Budnik et al.

[11] Patent Number: 5,745,006
[45] Date of Patent: Apr. 28, 1998

[54] METHOD OF COMPENSATING FOR DISTORTION IN AN AMPLIFIER

[75] Inventors: Brian Joseph Budnik, Watauga, Tex.; George Francis Opas, Park Ridge, Ill.

[73] Assignee: Motorola, Inc., Schaumburg, Ill.

[21] Appl. No.: 747,497

[22] Filed: Nov. 12, 1996

[51] Int. Cl.$^6$ ........................................................ H03F 1/32
[52] U.S. Cl. ........................... 330/149; 375/297; 455/126
[58] Field of Search ............................ 330/149; 332/107, 332/160; 375/296, 297; 455/126

[56] References Cited

U.S. PATENT DOCUMENTS

| | | |
|---|---|---|
| 4,700,151 | 10/1987 | Nagata . |
| 5,049,832 | 9/1991 | Cavers . |
| 5,148,448 | 9/1992 | Karam et al. ........................ 332/159 X |

OTHER PUBLICATIONS

Cavers, Amplifier Linearization Using a Digital Predistorter with Fast Adaption and Low Memory Requirements, IEEE Transactions on Vehicular Technology, vol. 39, No. 4, Nov. 1990 pp. 374–392.

Saleh and Salz, Adaptive Linearization of Power Amplifiers in Digital Radio Systems, The Bell System Technical Journal, Apr. 1983, pp. 1019–1033.

*Primary Examiner*—James B. Mullins
*Attorney, Agent, or Firm*—John H. Moore

[57] ABSTRACT

A method of providing compensation for distortion imparted to an input signal, principally by an amplifier (18), compares a delayed version of the input signal (34) to the amplifier's output signal. The result of the comparison is an error signal that is fed back to minimize distortion. This feedback technique is applied to a transmitter (10) in combination with predistortion that is selected to compensate for at least some of the distortion provided by the transmitter's output amplifier (18). The remainder of the compensation is provided by the error signal which can be generated by a relatively low gain analog feedback loop.

14 Claims, 2 Drawing Sheets

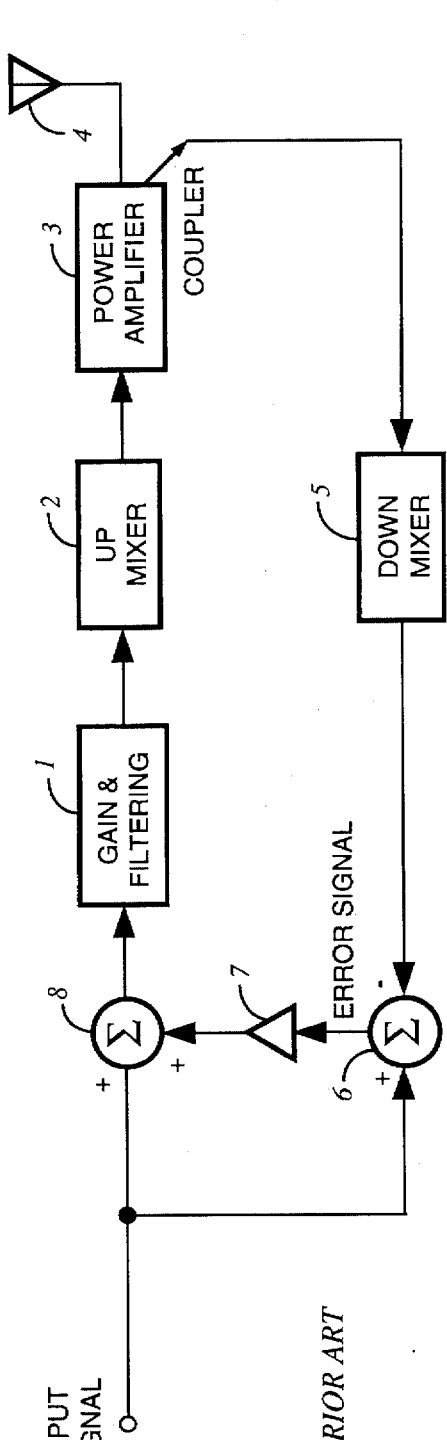
FIG. 1 *PRIOR ART*
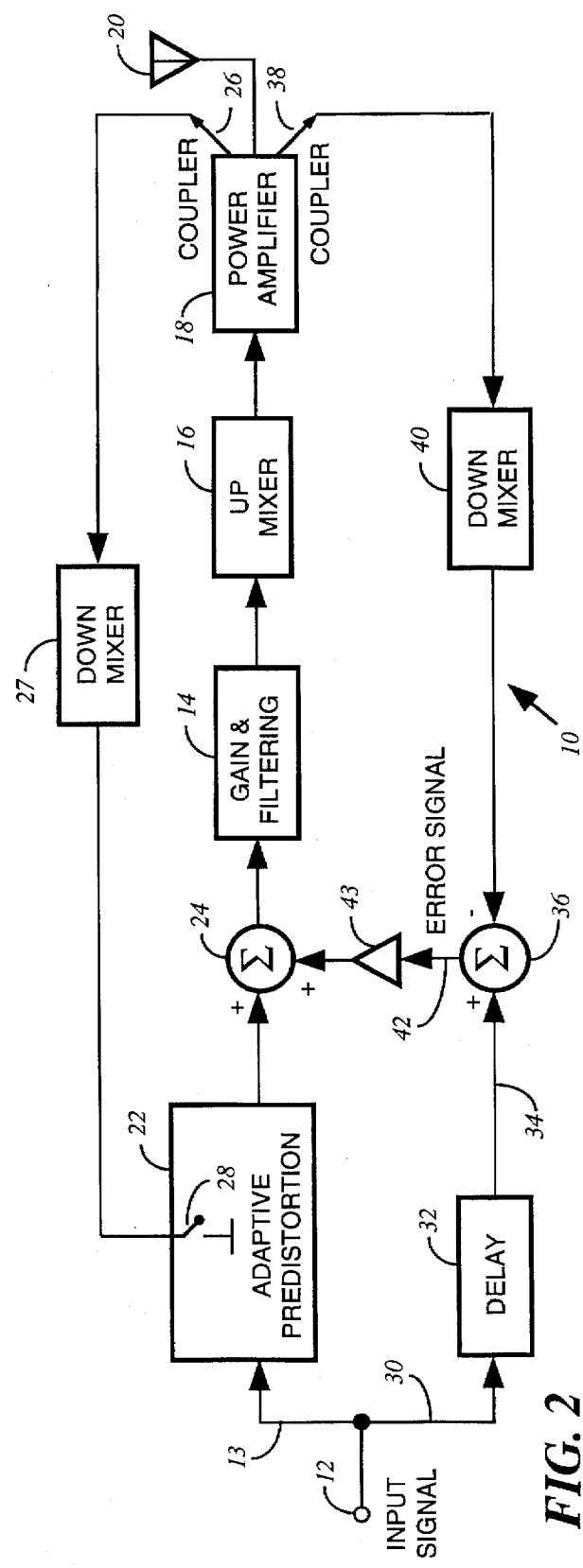
FIG. 2

METHOD OF COMPENSATING FOR DISTORTION IN AN AMPLIFIER

FIELD OF THE INVENTION

This invention is directed to the elimination of distortion in amplifiers, including distortion in power amplifiers that are used in RF (Radio Frequency) transmitters.

BACKGROUND OF THE INVENTION

The specifications for many amplifiers require output signals having very low distortion. This distortion principally comprises non-linearities in the amplifier's output, and they tend to change with time and/or temperature.

Currently, two methods are widely used for correcting non-linearities in an amplifier: analog feedback and predistortion. Analog feedback is thought to offer better long-term correction because it can continuously track the amplifier's output signal and correct for non-linearities using a negative feedback loop. However, to achieve the high level of correction that is usually required implies using a relatively high level of gain in the feedback loop. This introduces more wideband noise than is normally permitted and can result in system instability.

A circuit that uses a conventional feedback arrangement to correct for non-linearities is shown in FIG. 1. In this circuit, the input signal is processed by blocks 1 and 2, and amplified by a non-linear power amplifier 3 for transmission by an antenna 4. A portion of the output signal is frequency-translated to baseband by a mixer 5 and applied to a subtracting input of a summer 6. In this summer, the signal fed back from the mixer 5 is subtracted from the input signal to develop an error signal for correcting non-linearities. That error signal is amplified at 7 (if necessary) and combined with the input signal in another summer 8.

This conventional circuit relies completely on the feedback loop for correcting all non-linearities produced by the power amplifier 3. However, the amount of correction that can be achieved with this arrangement is limited because the feedback loop's delay and gain must be held well below a level which could cause instability.

Correction by use of predistortion involves predistorting the magnitude and phase of the input signal so as to cancel distortion introduced by the amplifier, thus leaving a linear output signal. Unfortunately, correction by this method is only temporary in most cases, because thermal drifts tend to change the amount of distortion generated by the amplifier. To compensate for these changes, it has been suggested that adaptive predistortion be used, wherein one periodically adjusts the predistortion so as to track with changes in the distortion generated by the amplifier. But when the amplifier is operating as a power amplifier in a transmitter, such periodic adjustment must normally be done when the transmitter is not transmitting messages. Hence, although frequent adjustment of the predistortion may be necessary, it is not practical because it adversely affects the transmitter's usable transmission time.

BRIEF DESCRIPTION OF THE FIGURES

FIG. 1, previously described, is a block diagram of a conventional circuit that uses a feedback loop for linearity correction;

FIG. 2 is a block diagram of a transmitter having a power amplifier with distortion, and in which compensation for the distortion is accomplished using adaptive predistortion in accordance with the invention.

DESCRIPTION OF THE PREFERRED EMBODIMENT

Figure 3:
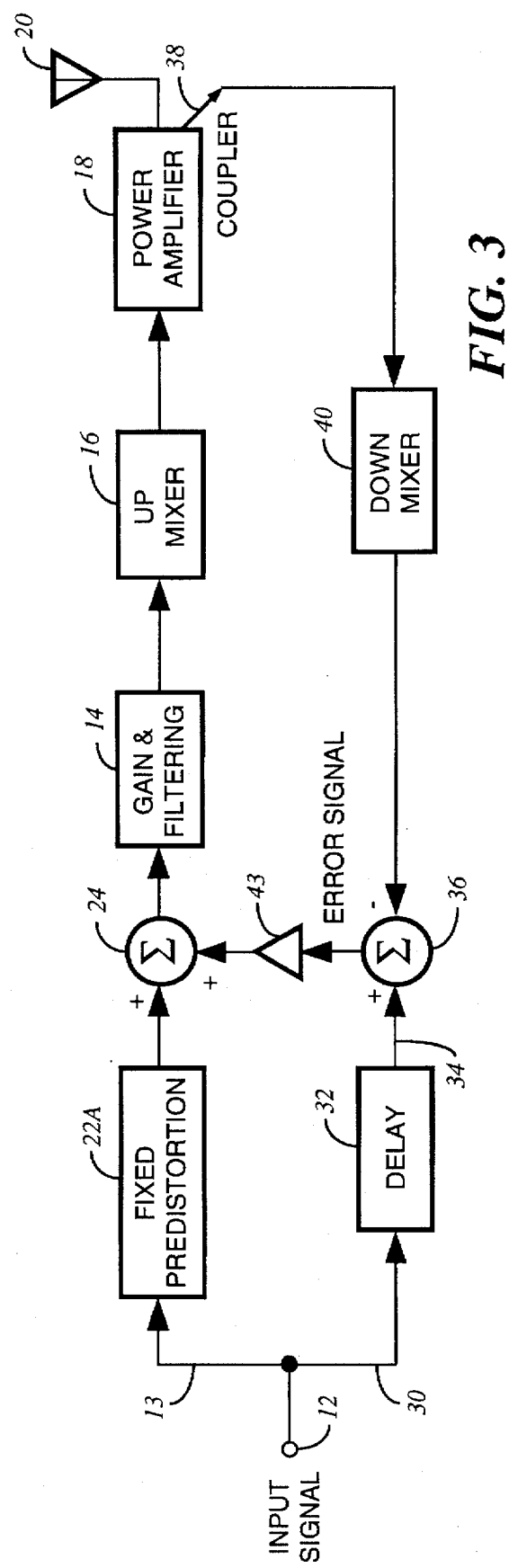
FIG. 3 is a block diagram of a transmitter having a power amplifier with distortion, and in which compensation for the distortion is accomplished using fixed predistortion in accordance with the invention.

The method by which this invention reduces distortion will be explained with reference to the transmitter 10 shown in FIG. 2. This transmitter receives an undistorted baseband input signal at an input terminal 12. Following some processing via a first signal path 13 that is discussed below, the signal is amplified and filtered in a conventional manner in block 14. The signal output from the block 14 is applied to a conventional up-mixer 16 which frequency-translates the signal to the frequency of the channel used by the transmitter 10. A conventional power amplifier 18 receives the signal output from the mixer 16 and amplifies it to a high power level for transmission by an antenna 20.

Blocks 14, 16 and 18 may impart some distortion to the input signal as they process it, but the principal contributor of distortion is the amplifier 18. Power amplifiers frequently generate unwanted intermodulation products, i.e., distortion. To compensate for the distortion that is produced, the input signal is predistorted by predistortion element 22. The predistortion provided by element 22 is selected so that it cancels the distortion produced by the power amplifier 18 and by other components of the transmitter. Applying such predistortion is a conventional approach to linearization and is discussed in several articles in the literature. One example is *Linear Amplification Technique for Digital Mobile Communication*, by Nagata, published in the Proceedings of the 39th IEEE Vehicular Technology Conference, Volume I, May 1989. This article discusses various aspects of predistortion, including adaptive predistortion that is said to be well suited to baseband implementation using DSP (Digital Signal Processor) techniques.

The predistorter 22 is a conventional DSP-based predistorter described in the literature, and may be implemented using a DSP96002 made by Motorola, Inc. and configured to perform adaptive predistortion as well known to those skilled in the art.

In general, the adaptive predistorter operates as follows. A training interval is established in which the transmitter 10 does not transmit messages, while predistortion element 22 sends a signal (such as a staircase signal) through a summer 24, blocks 14 and 16 and through power amplifier 18. A coupler 26 feeds back a portion of the output signal from the power amplifier 18 to a down-mixer element 27 that translates the signal to baseband and applies the baseband signal to predistortion element 22. An internal switch 28 in the adaptive predistortion element 22 is closed during the training interval for coupling the power amplifier's output signal (translated to baseband) to the predistortion element 22.

In the predistortion element, the fed-back signal is analyzed to determine the amount and type of distortion present, and predistortion is generated that will cancel the distortion found in the fed-back signal. That predistortion is stored in a memory in the predistortion element 22 for application to incoming signals. During this training session, a feedback loop described below is opened, as by opening a path 42 that supplies an error signal to the summer 24.

When the training interval ends, the switch 28 is opened and incoming signals are then received and predistorted per the predistortion data stored in memory. If the predistortion were perfect, and the distortion produced by the transmitter's power amplifier 18 and other components did not change, then the antenna 20 would transmit an undistorted signal (with path 42 open).

Unfortunately, predistortion may not be capable of perfectly canceling the distortion generated by the power amplifier 18. Also, the distortion generated by the power amplifier 18 usually changes over time, thus requiring the initiation of another training interval to recalibrate the predistortion to once again cancel the existing distortion. The switch 28 closes, path 42 opens, and the training interval begins again. Training intervals preferably occur on a periodic basis to allow the predistortion to be adapted to the changing distortion. Between training sessions, the predistortion remains constant.

Inherent in the use of DSP-based predistortion is the addition of significant delay to the incoming signal. Thus, in the signal path 13, the incoming signal receives both a calculated predistortion and a significant, measurable delay. It is this delay that prohibits including the predistortion element 22 within a negative feedback loop with the power amplifier 18 so as to assist in correcting distortion. The delay provided by the predistortion element 22 is so great that any such feedback loop would be unstable.

According to the invention, the input signal is also received at a second signal path 30, and in this second signal path a delay element 32 applies to the input signal a selected amount of delay. A delayed input signal appears on path 34 at the output of the delay element 32. Preferably, the amount of the delay provided by the delay element 32 substantially matches the delay provided by predistortion element 22. It is also preferred that only delay be applied to the input signal which is received by path 30 so that the signal on the path 34 is a delayed replica of the input signal.

The delayed input signal on path 34 is coupled to one input of a summer 36. The other input to the summer 36 is a baseband version of the output signal from power amplifier 18. That output signal, including predistortion added by predistortion element 22, is referred to herein as a compensated output signal.

A coupler 38 couples a portion of the compensated output signal to a conventional down-mixer 40 which frequency-translates the compensated output signal to baseband. That baseband signal is applied to the subtracting input of the summer 36. With this arrangement, the delayed input signal on path 34 is compared to the compensated output signal (converted to baseband) to generate an error signal at the output of the summer 36, on path 42. This error signal is applied to the input of an optional amplifier 43. The gain of the amplifier 43 may be greater or less than 1, depending on the amount of gain in the forward path (blocks 14–18), the amount of attenuation in the coupler 38, and the desired closed loop gain. Amplifier 43 may also perform filtering. The output of the amplifier 43 is applied to a positive input of the summer 24 for combining the error signal with the predistorted input signal.

It can be seen that if the predistortion perfectly cancels all distortion, then the error signal will be zero. That situation occurs, if at all, only immediately following a training session. Thereafter, the distortion generated by the power amplifier changes, resulting in an imperfect cancellation of the distortion. The amplifier's compensated output signal then contains some distortion which results in the generation of an error signal on path 42 that is representative of the level of uncompensated distortion. When that error signal is combined with the predistorted input signal, it tends to minimize the level of uncompensated distortion.

It will be appreciated that coupler 38 and down mixer 40 could be combined with coupler 26 and down-mixer 27; that is, depending upon design constraints, a single coupler and down mixer could be used to feed both the adaptive predistortion block 22 input switch 28 and the summer 36.

In operation of the illustrated transmitter, it is preferred that the predistortion effected by element 22 be adaptive, i.e., it recalculates the required predistortion from time to time; but it need not be. In situations where an amplifier's distortion does not change significantly over time, the predistortion element can be non-adaptive, such as a "one-time" factory adjustment characterizing the predistortion to be applied to the input signal; any needed additional correction is supplied by the feedback path that provides the error signal. An example of the use of a non-adaptive predistortion element is shown in FIG. 3 wherein like reference numerals are used on elements that correspond to elements of FIG. 2. The circuit of FIG. 3 is substantially the same as FIG. 2 except for the removal of coupler 26, down mixer 27, and the substitution of fixed predistortion element 22A for the adaptive predistortion element 22. Any but the most simple analog implementations of fixed predistortion will have too much transport delay to allow a stable feedback loop to be used without delay element 32. For that reason, the embodiment of FIG. 3 uses a combination of predistortion and feedback to optimize linearity and minimize wide-band noise, and permits implementation of a stable feedback loop even if fixed predistortion element 22A contains significant delay due to signal processing.

An advantage of the present invention is that predistortion with significant delay can be added to the input signal without creating instability that would be encountered in a conventional application of a feedback loop that would generate the error signal. Such instability is avoided by delaying the input signal and comparing the delayed input signal with the compensated output signal to generate the error signal.

The delay element 32 may be a conventional FIFO memory performing a shift-register-like function or a DSP such as a DSP56002 manufactured by Motorola, Inc. and conventionally configured to perform a delay function. The amount of delay selected will typically be tens of milliseconds, depending, of course, on the delay provided by the predistortion element 22.

The method of this invention allows the predistortion to compensate for most of the distortion provided by the power amplifier and other components of the transmitter. With adaptive predistortion, occasional or periodic training intervals allow convergence of the predistortion parameters to the optimum solution with the feedback loop disabled. That is, the step of combining the error signal with the predistorted signal is omitted (as by opening the path between summers 24 and 36) during training intervals when the predistortion is adjusted. When the adjustment is complete, the feedback loop is closed to resume applying an error signal to the summer 24. With this process, the predistortion provides most of the correction required, and the feedback loop can operate between training intervals with low gain, merely providing enough correction to cancel new distortion generated after the last training session.

It can be seen that the technique described herein is well suited for canceling distortion in a transmitter which uses predistortion to partly compensate for distortion caused by its output amplifier. A feedback loop that uses a delayed version of the input signal can employ just enough loop gain to compensate for worst-case nonlinearity due to thermal drift between adaptive predistortion training intervals.

Although the invention has been described in terms of a preferred embodiment, it will be obvious to those skilled in the art that many alterations and variations may be made without departing from the invention. Accordingly, it is intended that all such alterations and variations be considered as within the spirit and scope of the invention as defined as the appended claims.

We claim:

1. For use with an amplifier that generates an output signal having distortion, a method of compensating for the distortion, comprising:
   (a) in a first signal path, receiving an input signal to be applied to the amplifier;
   (b) adding predistortion to the input signal, the predistortion also adding delay to the input signal and being selected to compensate for at least some of the distortion provided by the amplifier, thus providing a predistorted input signal;
   (c) applying the predistorted input signal to the amplifier, thereby to generate a compensated output signal;
   (d) in a second signal path, receiving the input signal and applying a selected amount of delay to the input signal, thereby to provide a delayed input signal;
   (e) comparing the delayed input signal to the compensated output signal to generate an error signal representative of a level of uncompensated distortion; and
   (f) combining the error signal with the predistorted input signal such that the error signal tends to minimize the level of uncompensated distortion.

2. A method as set forth in claim 1 wherein the delay added in step (b) is great enough to prohibit the predistorted input signal from being combined with a feedback signal in a stable feedback loop.

3. A method as set forth in claim 1 wherein the selected amount of delay applied in step (d) substantially matches the delay added in step (b).

4. A method as set forth in claim 3 wherein the delayed input signal is substantially a delayed replica of the input signal.

5. A method as set forth in claim 1 wherein step (e) comprises subtracting the compensated output signal from the delayed input signal.

6. A method as set forth in claim 2 wherein step (f) comprises adding the error signal to the predistorted input signal.

7. A method as set forth in claim 1 wherein the amplifier is a power amplifier whose output signal is at a selected RF frequency, and wherein the compensated output signal is frequency-translated to baseband prior to being compared to the delayed input signal.

8. A method as set forth in claim 1 wherein the predistortion added in step (b) is adjusted from time to time, and wherein step (f) is omitted during such adjustment.

9. A method as set forth in claim 8 wherein step (f) is resumed following completion of each such adjustment.

10. For use with an amplifier that generates an output signal having distortion, a method of compensating for the distortion, comprising:
    (a) in a first signal path, receiving an input signal to be applied to the amplifier;
    (b) adding predistortion to the input signal, the predistortion also adding delay to the input signal and being selected to compensate for at least some of the distortion provided by the amplifier, thus providing a predistorted input signal;
    (c) applying the predistorted input signal to the amplifier, thereby to generate a compensated output signal;
    (d) in a second signal path, receiving the input signal and applying to the input signal a delay that substantially matches the delay added in step (b), thereby to provide a delayed input signal;
    (e) subtracting the compensated output signal from the delayed input signal to generate an error signal; and
    (f) combining the error signal with the predistorted input signal such that the error signal tends to minimize any uncompensated distortion.

11. A method as set forth in claim 10 wherein the delayed input signal is substantially a delayed replica of the input signal.

12. A method as set forth in claim 10 wherein the predistortion added in step (b) is adjusted from time to time during training intervals, wherein step (f) is omitted during such adjustment, and wherein step (f) is resumed following completion of each such adjustment.

13. A method as set forth in claim 12 wherein the compensated output signal is at a selected RF frequency, wherein the compensated output signal is frequency-translated to a baseband signal, and wherein the baseband signal is used during training intervals for determining the adjustment to the predistortion.

14. In an RF transmitter having a power amplifier that generates an output signal at a selected RF frequency and having distortion, a method of compensating for the distortion, comprising:
    (a) in a first signal path, receiving an input signal to be applied to the power amplifier;
    (b) adding predistortion to the input signal, the predistortion also adding delay to the input signal and being selected to compensate for at least some of the distortion provided by the power amplifier, thus providing a predistorted input signal;
    (c) applying the predistorted input signal to the power amplifier, thereby to generate a compensated output signal at the selected RF frequency;
    (d) frequency-translating the compensated output signal to baseband to provide a compensated baseband signal;
    (e) in a second signal path, receiving the input signal and applying to the input signal a delay that substantially matches the delay added in step (b), thereby to provide a delayed input signal;
    (f) subtracting the compensated baseband signal from the delayed input signal to generate an error signal; and
    (g) adding the error signal to the predistorted input signal, whereby the error signal tends to minimize any uncompensated distortion.

* * * * *